United States Patent
Sunkavalli et al.

(10) Patent No.: US 7,428,722 B2
(45) Date of Patent: Sep. 23, 2008

(54) VERSATILE MULTIPLEXER-STRUCTURES IN PROGRAMMABLE LOGIC USING SERIAL CHAINING AND NOVEL SELECTION SCHEMES

(75) Inventors: Ravi Sunkavalli, Milpitas, CA (US); Hare Krishna Verma, Cupertino, CA (US); Sudip Nag, San Jose, CA (US); Elliott Delaye, San Jose, CA (US)

(73) Assignee: CSwitch Corporation, Santa Clara, CA (US)

( * ) Notice: Subject to any disclaimer, the term of this patent is extended or adjusted under 35 U.S.C. 154(b) by 0 days.

(21) Appl. No.: 12/007,705

(22) Filed: Jan. 15, 2008

(65) Prior Publication Data

US 2008/0129334 A1 Jun. 5, 2008

Related U.S. Application Data

(62) Division of application No. 11/040,633, filed on Jan. 21, 2005, now Pat. No. 7,358,761.

(51) Int. Cl.
*H03K 19/00* (2006.01)

(52) U.S. Cl. .......................................... 716/17; 326/38
(58) Field of Classification Search ................... 716/17, 716/18; 326/37–41, 46
See application file for complete search history.

(56) References Cited

U.S. PATENT DOCUMENTS

| 2005/0117436 A1* | 6/2005 | Cox ....................... 365/230.03 |
| 2005/0140389 A1* | 6/2005 | Gliese et al. ................... 326/41 |
| 2005/0162933 A1* | 7/2005 | Madurawe ............. 365/189.05 |
| 2006/0129747 A1* | 6/2006 | Weber et al. ................. 711/100 |

* cited by examiner

*Primary Examiner*—Don P Le
(74) *Attorney, Agent, or Firm*—Peter Su

(57) ABSTRACT

Logic design apparatus and method provides serial multiplexer chains in a programmable logic fabric, each element in the chain either selects output of block, or passes output from earlier element of the chain. Select line is a decoder structure or output from configurable function generator that is configured at power-on to create correct selection. Using such structure, larger multiplexer, including priority multiplexers, tristate buses or larger look-up tables (LUTs) can be created. These novel structures can implement priority, non-priority or tristate multiplexers.

8 Claims, 10 Drawing Sheets

$$MY = I1 \cdot S' + I0 \cdot S$$
MY if I0 is 0
$$MY_{I0=0} = I1 \cdot S'$$
MY if I0 is 1
$$MY_{I0=1} = I1 + S$$
Figure 5a
The fast MUX chain is:
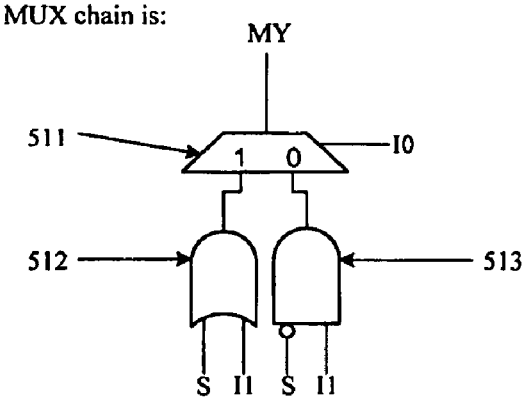
Figure 5b
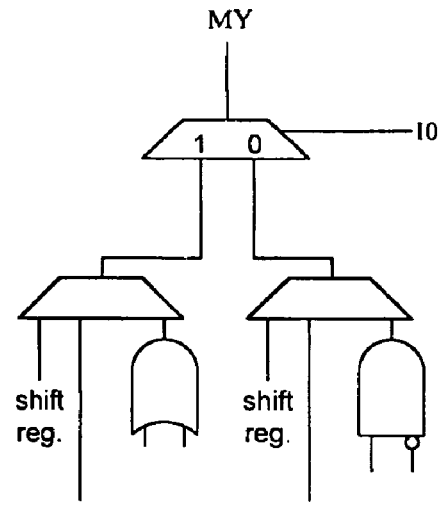
Figure 5c

VERSATILE MULTIPLEXER-STRUCTURES IN PROGRAMMABLE LOGIC USING SERIAL CHAINING AND NOVEL SELECTION SCHEMES This application is a division of U.S. application Ser. No. 11/040,633, filed 21 Jan. 2005, by inventors Ravi Sunkavalli, Hare Krishna Verma, Sudip Nag and Elliott Delaye, entitled *Versatile Multiplexer-Structures in Programmable Logic Using Serial Chaining and Novel Selection Schemes*.

FIELD

The invention relates to reconfigurable logic, particularly to apparatus and method for reconfiguring logic using serially-interconnected multiplexers.

BACKGROUND OF INVENTION

Various reconfigurable logic devices, such as field programmable gate arrays (FPGA) are available commercially, from companies such as Xilinx, Actel, and Altera. However, such conventional reconfigurable devices are limited in terms of programmability or functionality for realizing different logic structures.

For example, designers may implement logic in large multiplexers as programmable logic fabric using a tree like structure, as shown conventionally in FIG. 1a. Such multiplexer size is an 8:1 MUX, having data inputs I0 through I7, and select lines S0 through S2. Because the prior-art tree structure requires that connections be increased at first level 118 to implement larger multiplexers, it is difficult to create larger multiplexers due to size and space considerations. Levels 119 and 120 represent inputs of what could be a larger multiplexer structure. By adding on additional levels, such as 118, it is apparent that the resulting multiplexer structure would grow in size with each added level.

Accordingly, an improved approach for reconfigurable logic design is required.

SUMMARY

The invention resides in reconfigurable logic using serially-interconnected multiplexers. Preferably, a decoder structure uses serial multiplexer chaining to provide larger multiplexers.

In particular, logic design apparatus and software-automated method provides serial multiplexer chains in a programmable logic fabric, wherein one or more element in the chain either selects the output of that element, or passes output from earlier element of the chain. The select line is a decoder structure or output from a configurable function generator that is configured at power-on to enable correct selection. Using such structure, larger multiplexer, including priority multiplexers, tristate buses, or larger look up tables (LUTs) can be created. These novel structures can implement a MUX of priority, non-priority, and/or tristate multiplexers.

BRIEF DESCRIPTION OF DRAWINGS

FIG. 5a is a logic equation representing two logical outcomes as defined by setting configuration bit I0 to either of two possible settings in a faster implementation of FPGA serial MUX chain. The path from MUX-in, I0, to MUX-out, MY, is made much faster comparatively by eliminating effectively one or more delay elements in alternative or currently in-circuit approaches.

FIG. 5b shows an implementation of the logic equation in FIG. 5a in a fast FPGA serial MUX using a select input I0 that is output from lower serial MUX chain.

FIG. 5c is a schematic drawing of the carry select method to create a serial MUX chain with a fast path from I0 to MY. This configuration has 2 levels and highlights the path delay addition through logic elements.

DETAILED DESCRIPTION

In general, field programmable gate array (FPGA), and/or other reconfigurable logic may employ or otherwise configure a set of interconnected multiplexers (MUX), via a decoder or functionally equivalent structure preferably with serial chaining thereof to provide larger multiplexers or other desired logic.

As used herein, the term multiplexer, or MUX, is defined as any structure or the digital logic element used to perform multiplexing.

Serially coupled multiplexer chains preferably provide programmable logic fabric or equivalent digital behavior, where one or more element in the chain either selects the output of that element, or selects the output from an earlier element of such configurable chain. In particular, the value fed to a select line of such a logical chain element may be the output of a programmable decoder structure or the output from a configurable function generator that is configured at power-on to generate the desired selection.

Thus by using such scalable programmable logic architecture, larger multiplexer, including priority multiplexers, tristate buses and/or larger look up tables (LUTs) can be configured as desired to build, for example, prototype digital systems or combinatorial logic. Furthermore, these structures can be used to implement priority multiplexers, non-priority multiplexers, tristate multiplexers or other Boolean logic.

Figure 1A:
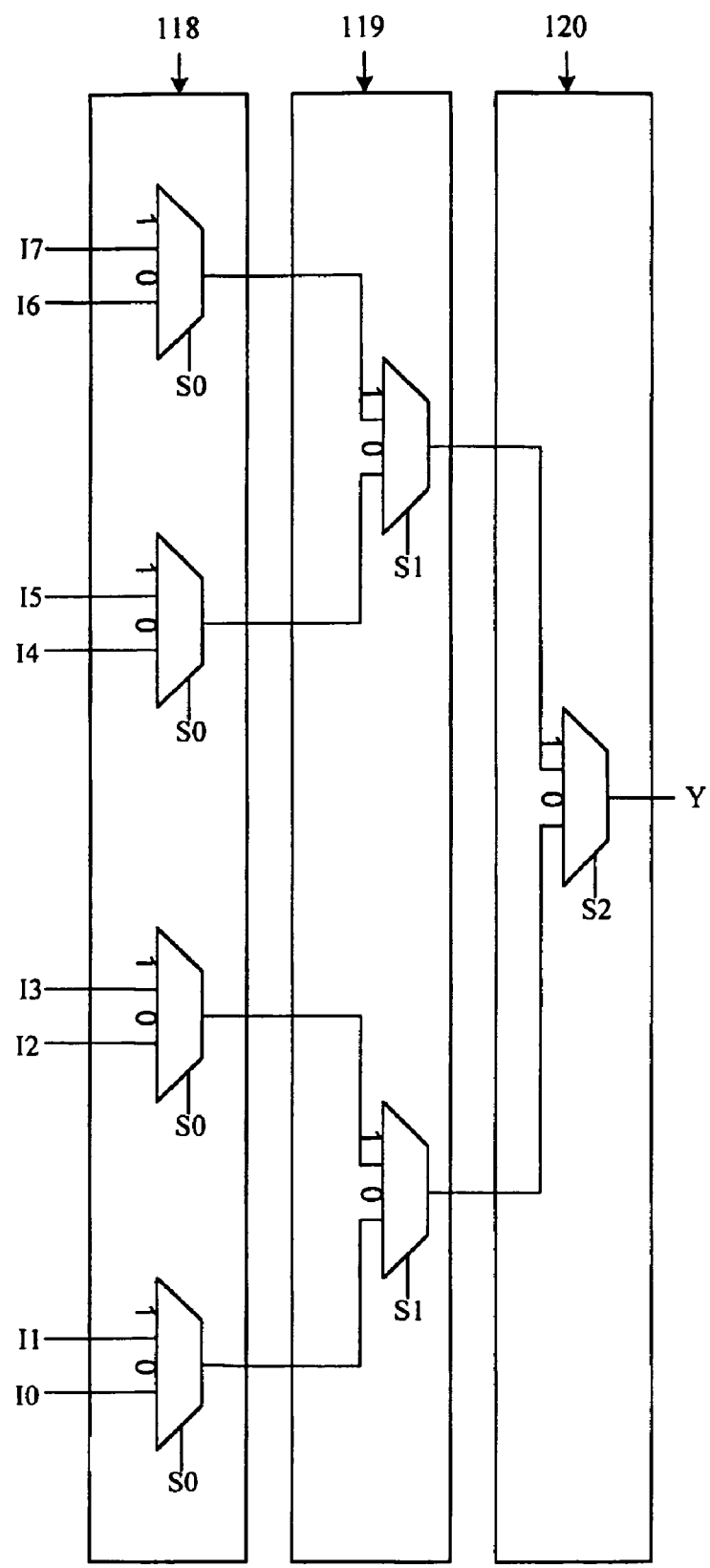
FIG. 1a is a schematic drawing of prior-art tree structure used as a multiplexer.
Figure 2:
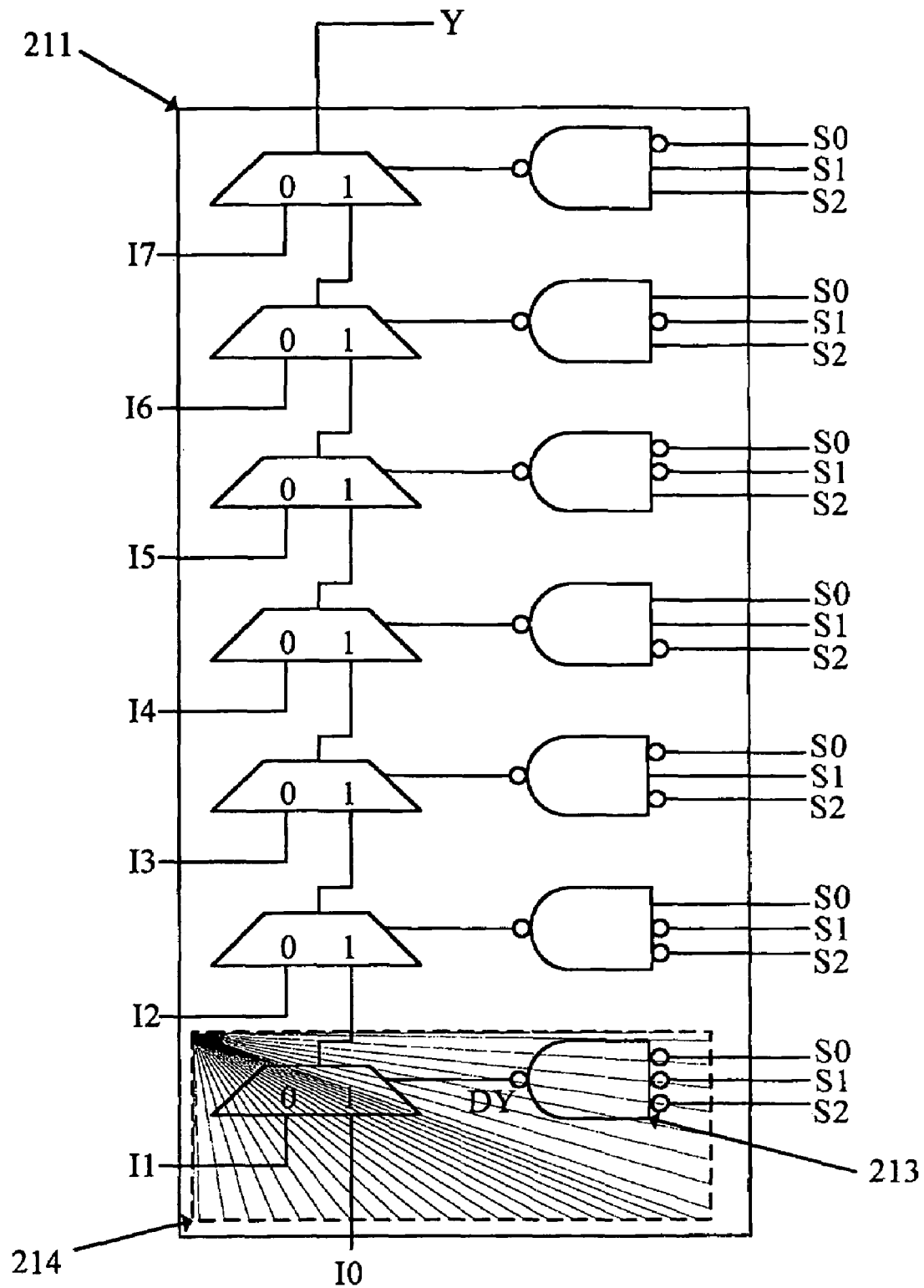
FIG. 2 is a schematic drawing of serial MUX chaining used to create larger multiplexers as implemented in one embodiment of the current invention.

FIG. 2 shows an implementation that converts the tree-like structure multiplexer of FIG. 1a to a serial MUX2 chaining 211 structure utilizing individual MUX2 chain elements 214 according to the programmable implementation described herein. As shown, a plurality of multiplexers are chained or otherwise coupled serially, each multiplexer being separately coupled further to a unique decoder NAND logic, such as NAND gate 213, for programming thereof. In a programmable logic fabric, this implementation has many benefits for flexible design and operation.

Optionally, serial MUX2 chain 211 with modified decoder structures of 213 can be coupled with one or more similar chains to implement even larger multiplexers. In such a case the number of select lines in each chain is commensurate with the number of inputs of that chain. For example, for two chains similar to 211 with eight inputs, it is possible to address the inputs on each chain with six select lines and appropriate configuration bits. Additionally, an n input multiplexer can be constructed using $\log_2(n)$ select lines.

Figure 3:
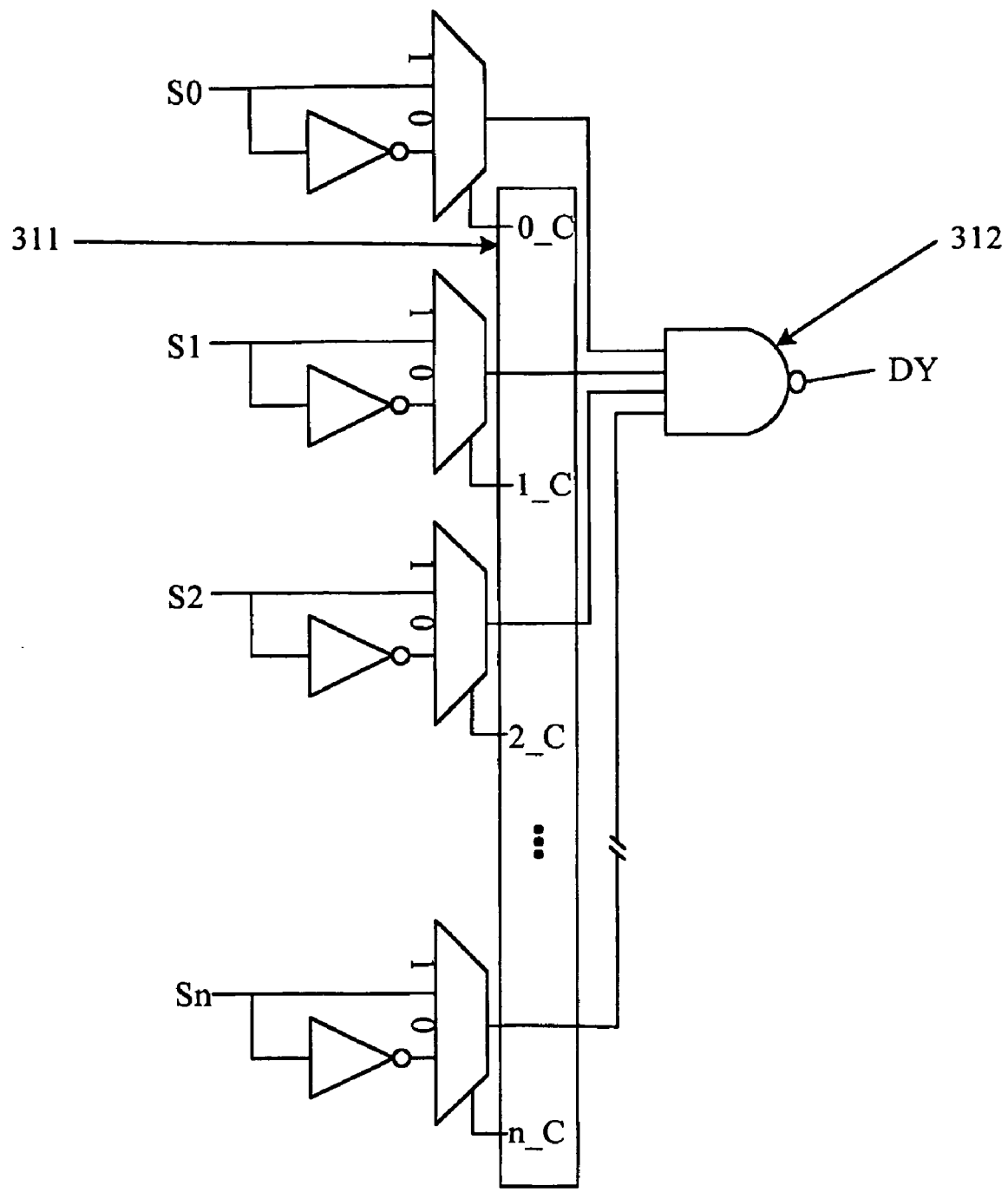
FIG. 3 is a schematic drawing of a n-input decoder as implemented in one embodiment of the current invention.

More particularly regarding decoder logic, FIG. 3 shows a representative decoder implementation with DY output of the decoder; here signal lines 311, 0_C through n_C, serve as memory configuration bits or digital settings, preferably written into synchronously or asynchronously at power-on or other pre-selected condition or event of the reconfigurable device. By writing different values in the configuration bits, different decoder outputs can be obtained based on values fed to the select lines S0 through Sn. In one embodiment of the invention, the configuration bits are written to via a programmable software application or firmware instructions coupled thereto. The logic output at DY of FIG. 3 is determined by the logical output of NAND function 312 of the values passed to select lines S0 through Sn as determined by configuration bits 0_C through n_C. Based on the deterministic nature of the decoder logic function of configuration bits and select lines, it is contemplated that software can determine the necessary decoder characteristics, configuration bit values and select line values to simulate and design a wide range of multiplexers and logic functions.

In one embodiment of the current invention, software can be written to translate symbolic or schematic designs into a layout of serially coupled multiplexers. This is useful in the implementation of an electronic design automation system typically used by circuit designers. Many logical elements can be constructed using serially coupled multiplexers, as illustrated in FIGS. 4a, 4b, 5a, 5b, 7a, and 7b. By analyzing a desired schematic design of a circuit, it is possible to determine, in software, what configuration of serially couple multiplexers and configuration bits are needed to construct and equivalent circuit. The equivalent circuit design can then be output for use in analysis or manufacture of circuits including, but limited to, decoders, LUTS, adders, and multiplexers.

Figure 4A:
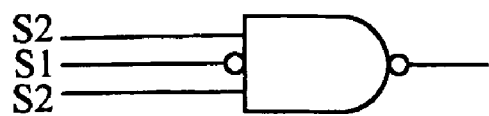
FIG. 4a is a functional schematic drawing of a decoder as implemented in one embodiment of the current invention.
Figure 4B:
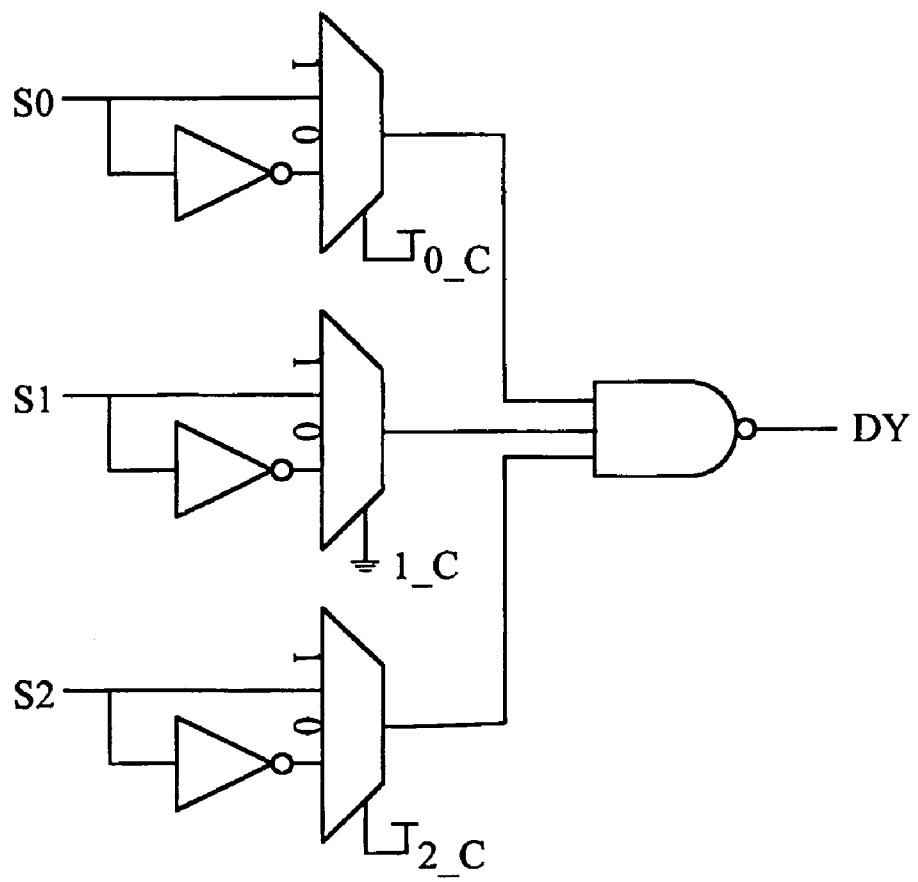
FIG. 4b is a schematic drawing of a decoder as implemented in one embodiment of the current invention with configuration bits fixed to a value. It shows an implementation of the current invention equivalent to the NAND structure depicted in FIG. 4a for use in the structure depicted in FIG. 2.

In addition for illustration, FIGS. 4a and 4b show a sample decoder implementation with the necessary configuration values. FIG. 4b shows an equivalent structure to that shown in FIG. 4a as implemented in one embodiment of the present invention. By reprogramming configuration bits 0_C through 2_C, the structure of FIG. 4b has the flexibility to provide various outputs at DY with a particular set of select line values at S0 through S2.

Figure 1B:
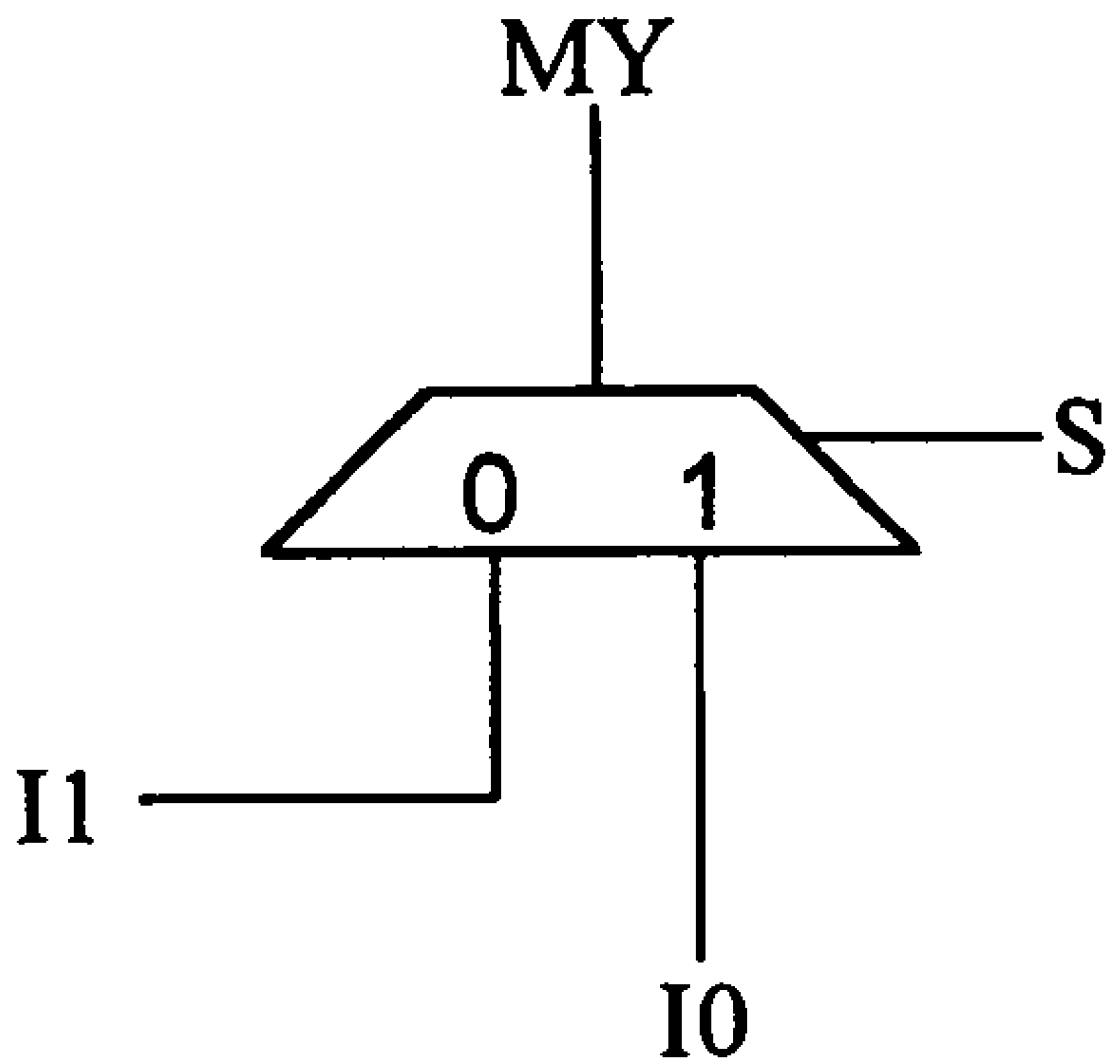
FIG. 1b is a schematic drawing of 2-input MUX as implemented in one embodiment of the current invention.

FIG. 1b is an implementation of a 2-input MUX (MUX2) chain programmable element; wherein the signal at S can be the output of other digital logic, programmable software application or firmware instructions coupled thereto. Hence in an FPGA application, a MUX2 chain may be implemented with other chain logic. In the case of a MUX2 chain element as depicted in FIG. 1b, the path from I0 to MY is much slower if combined with other logic elements than the path from S to MY. In such MUX2 chaining, the I0 to MY delay gets added to each level of logic processing. Input I1 and S are being fed to the block that is valid after a fixed time for all the MUX2 elements of the chain. A MUX2 chain is implemented preferably for a fast delay from I0 to MY.

In a MUX chain, typically there are other logic elements. Such elements are present in the I0 to MY path. In the current invention, the path from I0 to MY is designed to be faster by avoiding delay causing logic elements in the carry-chains.

Optionally, extra MUX2 chains may be added to build one or more larger multiplexers. It is contemplated that the largest multiplexer may be limited by the number of select lines. Since configuration bits uniquely program each decoder, combinatorial math determines how many select lines are needed for an n-input multiplexer. In FIG. 1b, Input I1 to the MUX chain element can be the output of another multiplexer, in which case the MUX2 chain thereby creates larger multiplexers.

Additionally, input I1 to the MUX2 chain can be the output of an n-input look-up-table (LUT). This MUX2 chain structure is flexible; it can also be used to implement more specific multiplexer structure such as the tristate structure depicted in FIGS. 7a and 7b. Moreover, MUX chaining provides a way to create large size LUTs. Hence, MUX chaining not only enables the ability to address larger LUTs, it also enables the creation of larger LUTs. Each element of a LUT can be addressed with a particular set of coordinate configuration bits and select line values. Input I1 to the MUX chain can be output of an n-input ROM. Larger MUX chaining further creates larger ROMs via such cascaded scheme.

Figure 6:
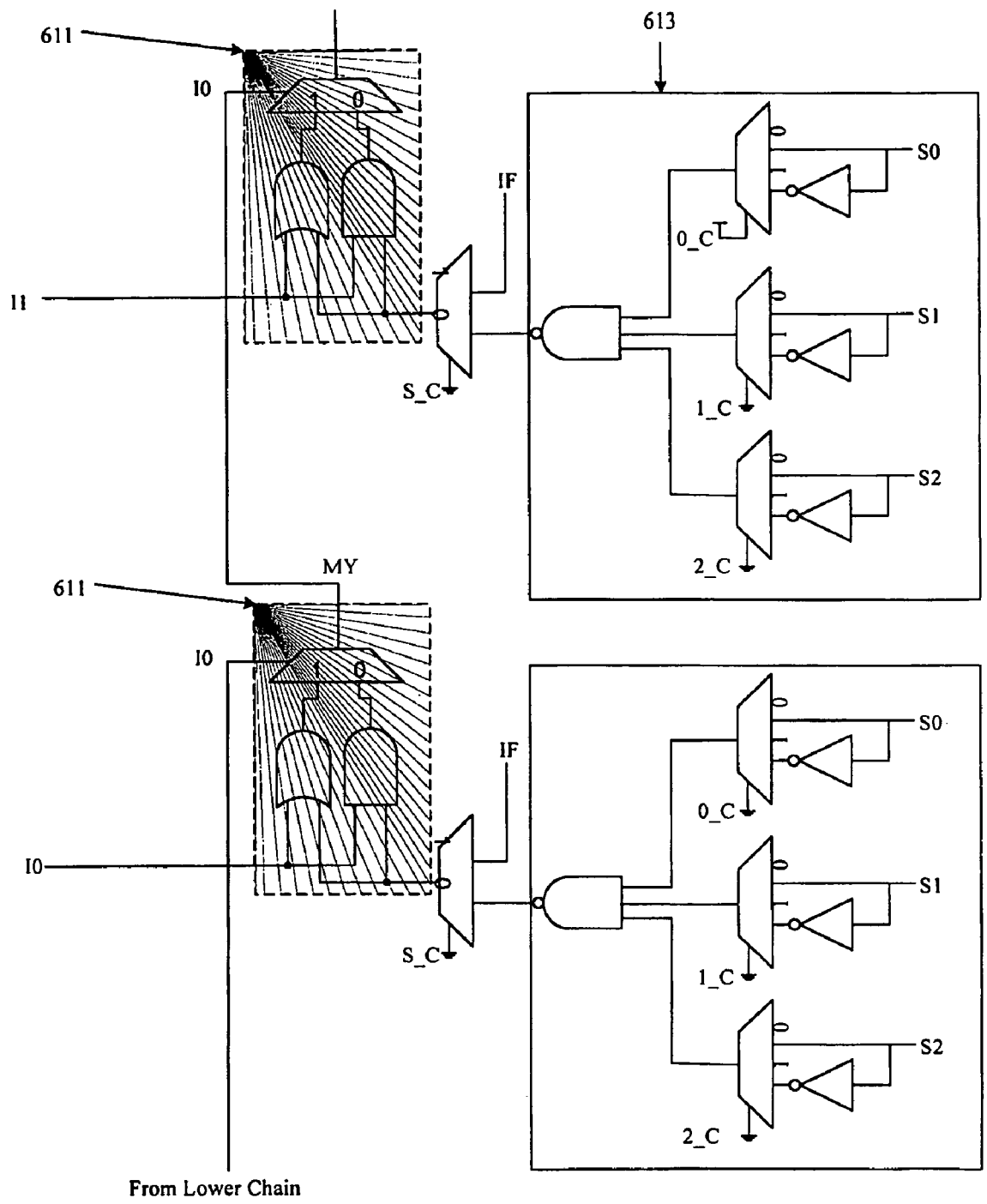
FIG. 6 is a schematic drawing of fast serial MUX chain as implemented in one embodiment of the current invention. The decoder structure 613 is shown with three select lines, S0, S1, and S2. IF is an input from a configurable logic function. The chain is optimized for a minimum delay from I0 to MY.
Figure 7A:
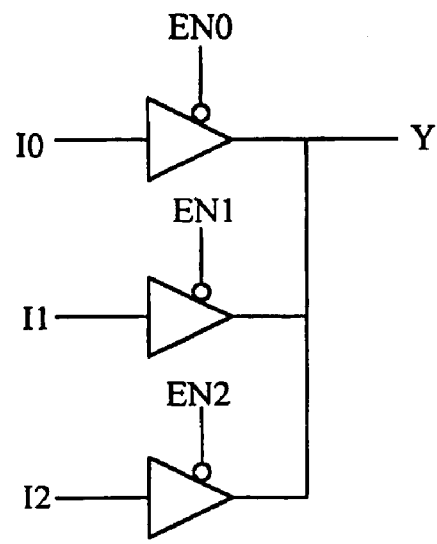
FIG. 7a is a schematic drawing of tristate logic gate to be implemented using serial MUX chaining.
Figure 7B:
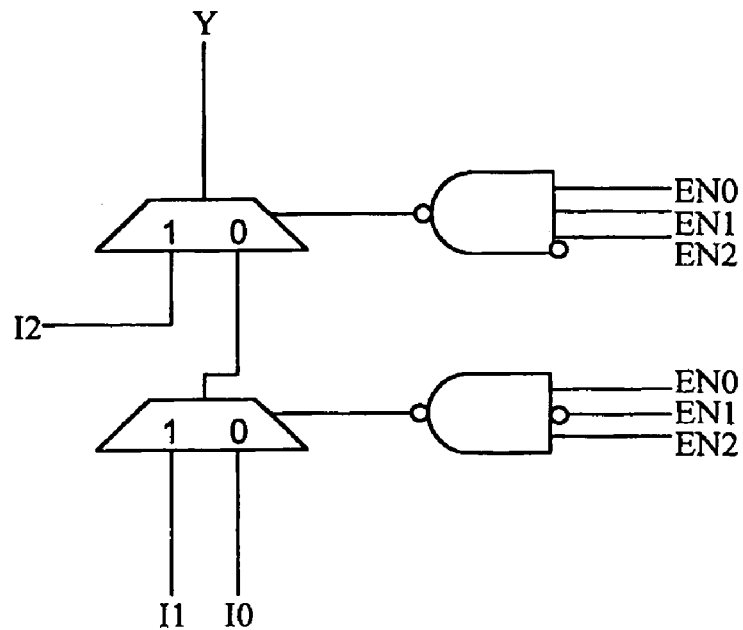
FIG. 7b is an equivalent schematic drawing of the tristate logic gate shown in FIG. 7a as implemented in one embodiment of the current invention using serial MUX chaining.

There is another input, the so-called IF signal, as called out in FIG. 6, that can flexibly control such a MUX chain. IF can be an output of one or more configurable function generators or logic sources. The IF signal can be used to implement priority multiplexer in a multiplexer chain. IF may also be generated by a look-up table output and this IF signal can be implement an arbitrary function to build complex priority multiplexers.

FIG. 5a shows logic equation representing two logical outcomes as defined by setting configuration bit I0 to either of two possible settings in a faster implementation of FPGA serial MUX chain. FIG. 5b schematic drawing represents a faster implementation in FPGA using a serial MUX chain element augmented with AND gate 512 on one input of MUX2 511 and OR gate 513 on the other. FIG. 5b is the schematic representation of the logic equation in FIG. 5b. FIG. 5c is typical design element used to reduce the delay addition as accrued from the path through the various logical elements of the circuit. By eliminating effectively one or more delay elements, the path from I0 to MY is made comparatively faster to alternative approaches or currently in circuit approaches. This structure is noted to have a high level of utility in typical configurable logic design due to the fast path from I0 to MY. By moving I0 to the select line of the MUX, and the shift register to one input of each logical element, the path from I0 to MY is made much faster than if the signal had to traverse the additional logical elements coupled to the inputs of the MUX.

FIG. 6 schematic drawing represents a fast serial MUX chain as implemented in one embodiment of the present invention. In this case the MUX chain element is constructed by a decoder structure 613 coupled to one input of a MUX2 that is coupled to a fast MUX chain element 611 at its output.

Here, the other input of the aforementioned MUX2 coupling 613 and 611, is coupled to the IF signal, thus providing for an externally programmable fast priority multiplexer.

Figure 8A:
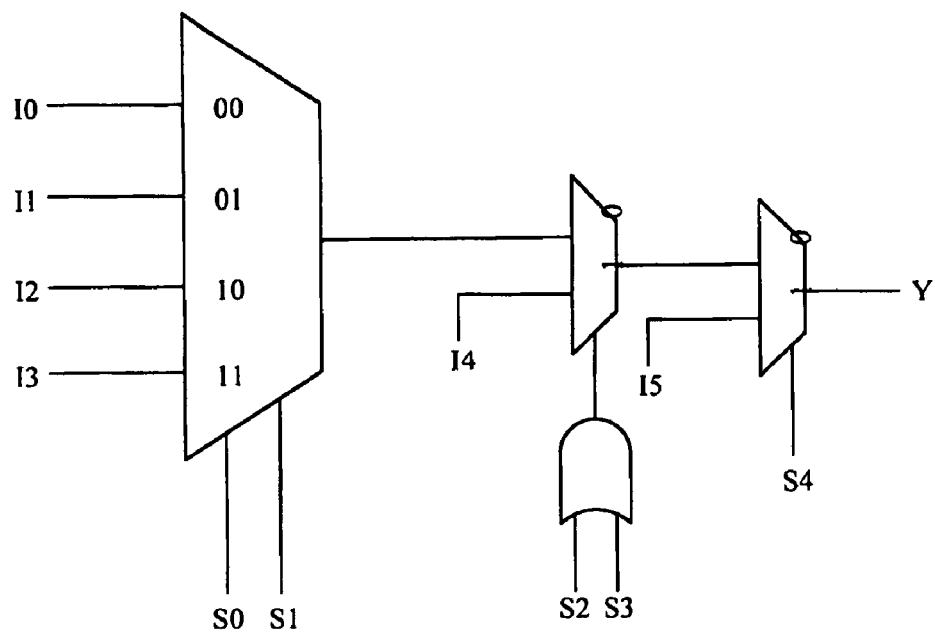
FIG. 8a is a schematic drawing of 6-input multiplexer structure to be implemented using serial MUX chaining.
Figure 8B:
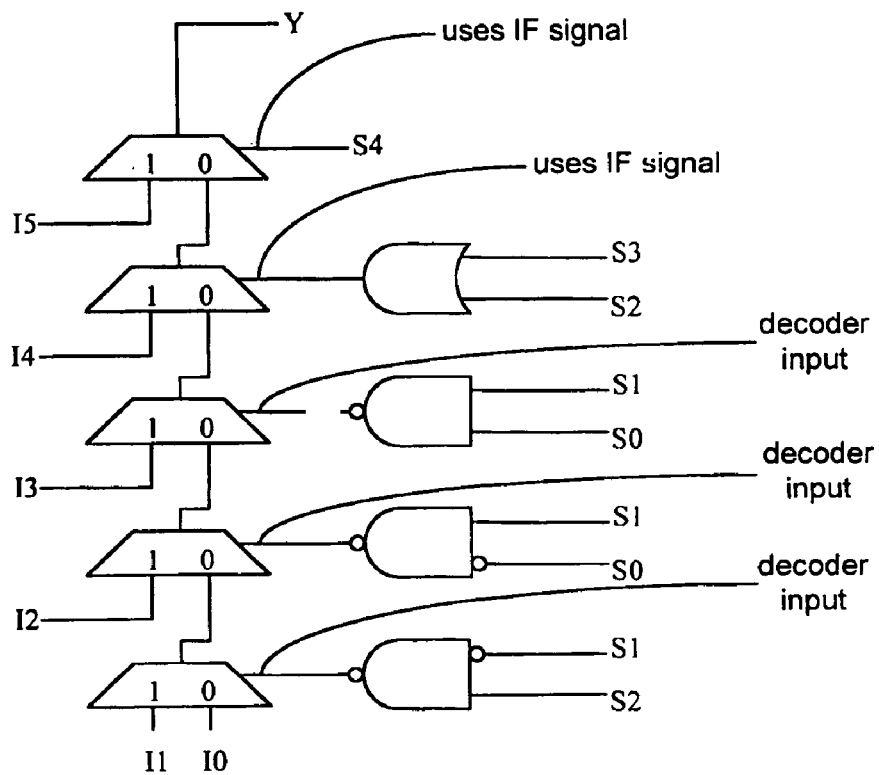
FIG. 8b is an equivalent schematic drawing of the 6-input multiplexer shown in FIG. 8a as implemented in one embodiment of the current invention using serial MUX chaining.

FIG. 8a schematic drawing shows a 6-input multiplexer structure. FIG. 8b schematic drawing shows 6-input multiplexer constructed with MUX2 chain elements. FIG. 8b illustrate the use of MUX2 chaining, as implemented in one embodiment of the present invention, to construct an equivalent circuit to that depicted in FIG. 8a. FIG. 8b uses IF signal in some places to implement the priority selector as shown in FIG. 8a.

Figure 9:
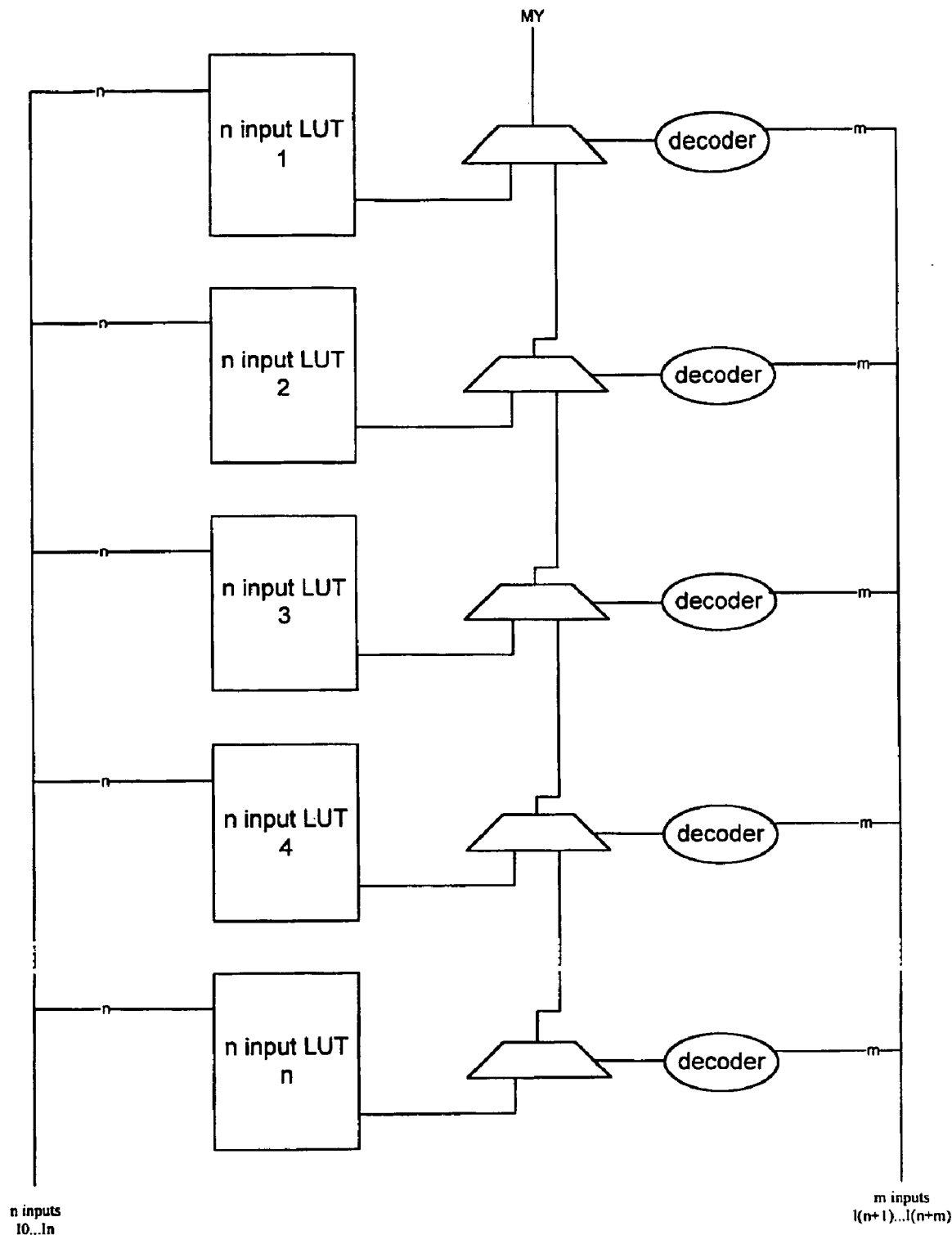
FIG. 9 shows an (n+m)-input look-up table (LUT) implemented with n n-input LUT's and m select lines using serial MUX chain as implemented in one embodiment of the current invention.

FIG. 9 schematic drawing depicts a (n+m) LUT implemented using n n-input LUTs, m select line decoders and serial chain MUXs as implemented in one embodiment of the present invention. FIG. 9 illustrates how serial MUX chaining can be used to implement large LUTs.

Foregoing descriptions of specific embodiments of the invention have been presented for purposes of illustration and description. They are not intended to be exhaustive or to limit the invention to the precise forms disclosed. Modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

We claim:

1. Reconfigurable logic design method comprising the steps of:
    coupling a first multiplexer to a second multiplexer;
    applying a first programming signal to the first multiplexer, and a second programming signal to the second multiplexer, thereby enabling such multiplexers to be programmably configured to represent functionally therefor a logic design.

2. The reconfigurable logic design method of claim 1 wherein:
    one or more configuration bits are applied to select lines of said multiplexers at a power-on event.

3. The reconfigurable logic design method of claim 1 wherein:
    a programmable software writes one or more configuration bits to the multiplexers.

4. The reconfigurable logic design method of claim 1 wherein:
    a configurable function generator is coupled to a programmable decoder structure to enable programmable control thereof.

5. The reconfigurable logic design method of claim 1 wherein:
    one or more of the multiplexers is configured to generate a tristate or priority output.

6. The reconfigurable logic design method of claim 1 wherein:
    one or more of inputs to the multiplexers is provided by a Read-only Memory (ROM) or a look-up table (LUT).

7. In an electronic design automation system comprising a processor and a memory, a design method for implementing reconfigurable logic comprising the steps of:
    processing a first design file comprising a first logic design; and
    generating a second desogn file comprising a second logic design,
    wherein the second logic design is functionally equivalent to the the first logic design, the second design file for implementing a reconfigurable logic according to the second logic design, the second design file comprising one or more representation of a plurality of multiplexers, such that a first multiplexer representation is coupled serially to a second multiplexer representation, thereby enabling one or more programmable decoder representation coupled separately to each such multiplexer representation.

8. Reconfigurable logic with fast path capabilities comprising:
    a first multiplexer;
    a second multiplexer;
    a third multiplexer;
    means for performing a logical AND function; and,
    means for performing a logical OR function;
    wherein said second and third multiplexer are serially coupled to said first multiplexer;
    wherein a unique shift register is couple one input of each said second and third multiplexer, wherein the output of said means for performing an AND function is coupled to one input of said second multiplexer and the output of said means for performing an OR function is coupled to said third multiplexer; wherein an input signal can be fed to the select line of said first multiplexer.

* * * * *